(12) United States Patent
Shi

(10) Patent No.: US 10,797,853 B2
(45) Date of Patent: Oct. 6, 2020

(54) HIGH-SPEED DECISION DEVICE

(71) Applicant: AMLOGIC (SHANGHAI) CO., LTD., Shanghai (CN)

(72) Inventor: Ming Shi, Shanghai (CN)

(73) Assignee: AMLOGIC (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 16/728,284

(22) Filed: Dec. 27, 2019

(65) Prior Publication Data
US 2020/0213073 A1    Jul. 2, 2020

(30) Foreign Application Priority Data

Dec. 29, 2018   (CN) .......................... 2018 1 1642624

(51) Int. Cl.
*H04L 7/02*    (2006.01)
(52) U.S. Cl.
CPC ...................... *H04L 7/02* (2013.01)
(58) Field of Classification Search
CPC ..... H04L 7/0025; H04L 7/0029; H04L 27/20; H04L 7/0337; H04L 7/033; H04L 7/02
USPC .................. 375/354–255, 371–176
See application file for complete search history.

(56) References Cited

U.S. PATENT DOCUMENTS

| | | | | |
|---|---|---|---|---|
| 9,001,869 B2 * | 4/2015 | Ahmadi | ................ | H03L 7/0996 375/211 |
| 2007/0153951 A1 * | 7/2007 | Lim | ........................ | H03L 7/085 375/376 |
| 2014/0037035 A1 * | 2/2014 | Chung | ................... | H03H 11/20 375/373 |
| 2014/0176239 A1 * | 6/2014 | Duggal | ............... | H03F 3/45744 330/260 |
| 2014/0321515 A1 * | 10/2014 | Ponton | ..................... | H03D 3/00 375/219 |
| 2014/0321577 A1 * | 10/2014 | Kuttner | ................... | H04L 27/20 375/302 |
| 2015/0139377 A1 * | 5/2015 | Song | ..................... | H04L 7/0029 375/371 |
| 2015/0270846 A1 * | 9/2015 | Deguchi | .............. | H03M 1/462 341/156 |

(Continued)

FOREIGN PATENT DOCUMENTS

| | | |
|---|---|---|
| CN | 101610083 A | 12/2009 |
| CN | 103401537 B | 6/2016 |

*Primary Examiner* — Emmanuel Bayard
(74) *Attorney, Agent, or Firm* — The Marbury Law Group, PLLC

(57) ABSTRACT

The invention relates to a high-speed decision device that comprises a first branch and a second branch that are connected in parallel between a power supply end and a clock signal input end; wherein the first branch is used for providing a normal-phase input end, and the second branch is used for providing an inverted-phase input end; a first adjusting point and a second adjusting point are arranged; and an adjusting branch is arranged between the first adjusting point and the second adjusting point, and the adjusting branch is used for adjusting the response speed when the clock signal changes. The benefit of the invention is that the response time of the circuit is further improved, the resolution of the high-speed decision device is improved, and the clock and data recovery performance of the high-speed decision device is further improved.

8 Claims, 2 Drawing Sheets

(56) References Cited

U.S. PATENT DOCUMENTS

2015/0311875 A1* 10/2015 Chen ..................... G11C 7/065
327/52

* cited by examiner

Prior Art

US 10,797,853 B2

HIGH-SPEED DECISION DEVICE

CROSS-REFERENCE TO RELATED APPLICATIONS

The present application claims priority to and the benefit of Chinese Patent Application No. CN 201811642624.8, filed on Dec. 29, 2018, the entire content of which is incorporated herein by reference for all purposes.

BACKGROUND OF THE INVENTION

Field of the Invention

The invention relates to the technical field of high-speed data transmission, and more particularly, to a high-speed decision device.

Description of the Related Art

At present, as shown in FIG. 1, the decision device for a high-speed clock and data recovery circuit includes a differential circuit and a decision circuit. When a clock signal CLK is low, the high-speed decision device is in a reset state, and a normal-phase output end Out+ and an inverted-phase output end Out− are at high levels; when the clock signal CLK is high, an input circuit judges the levels of input signals In+ and In−. Since there exists a regenerative feedback circuit including switch transistors M3, M4, and M2, M1, the regenerative feedback circuit pulls the output of a high-level section low, and pulls the output of a lower-level section high.

For the above-mentioned circuit, a certain length of response time is required to provide initial voltages on source sides of the switch transistors M3 and M1, causing the operating speed of the above-mentioned decision device to be reduced.

SUMMARY OF THE INVENTION

Given that the foregoing problems exist in the prior art, the present invention provides a high-speed decision device.

The technical solution is as follows: a high-speed decision device, applied to a high-speed clock and data recovery circuit, including: a first branch and a second branch, connected in parallel between a VDD and a clock signal input end; in which the first branch is configured to provide a normal-phase input end, the second branch is configured to provide an inverted-phase input end, a first adjusting point is arranged at the normal-phase input end and VDD, and a second adjusting point is arranged at the inverted-phase input end and VDD; an adjusting branch is arranged between the first adjusting point and the second adjusting point to adjust a respond speed of a clock signal change.

Preferably, the adjusting branch includes: a first MOS transistor, in which a gate of the first MOS transistor is connected to the clock signal input end, a source of the first MOS transistor is connected to the ground through a first resistor, and a drain of the first MOS transistor is connected to the first adjusting point; a second MOS transistor, in which a gate of the second MOS transistor is connected to the clock signal input end, a source of the second MOS transistor is connected to the source of the first MOS transistor, and a drain of the second MOS transistor is connected to the second adjusting point.

Preferably, the first branch and the second branch form a differential amplifier circuit, the differential amplifier circuit includes: a differential amplifier module, controllably connected between the clock signal input end, the normal-phase input end, the inverted-phase input end, the first adjusting point and the second adjusting point; a decision module, controllably connected between the first adjusting point, the second adjusting point, a positive output end, and a negative output end.

Preferably, the differential amplifier module includes: a first switch transistor, in which a gate of the first switch transistor is connected to the clock signal input end, and a source of the first switch transistor is connected to the ground; a second switch transistor, in which a gate of the second switch transistor is connected to the normal-phase input end, a source of the second switch transistor is connected to a drain of the first switch transistor, and a drain of the second switch transistor is connected to the first adjusting point; and a third switch transistor, in which a gate of the third switch transistor is connected to the inverted-phase input end, a source of the third switch transistor is connected to the source of the second switch transistor, and a drain of the third switch transistor is connected to the second adjusting point.

Preferably, the decision module includes: a fourth switch transistor, in which a gate of the fourth switch transistor is connected to the clock signal input end, a source of the fourth switch transistor is connected to VDD, and a drain of the fourth switch transistor is connected to the negative output end; a fifth switch transistor, in which a gate of the fifth switch transistor is connected to the positive output end, a source of the fifth switch transistor is connected to VDD, and a drain of the fifth switch transistor is connected to the negative output end; a sixth switch transistor, in which a gate of the sixth switch transistor is connected to the negative output end, a source of the sixth switch transistor is connected to VDD, and a drain of the sixth switch transistor is connected to the positive output end; a seventh switch transistor, in which a gate of the seventh switch transistor is connected to the clock signal input end, a source of the seventh switch transistor is connected to VDD, and a drain of the seventh switch transistor is connected to the positive output end; an eighth switch transistor, in which a gate of the eighth switch transistor is connected to the gate of the fifth switch transistor, a source of the eighth switch transistor is connected to the first adjusting point, and a drain of the eighth switch transistor is connected to the drain of the fifth switch transistor; and a ninth switch transistor, in which a gate of the ninth switch transistor is connected to the gate of the sixth switch transistor, a drain of the ninth switch transistor is connected to the drain of the sixth switch transistor, and a source of the ninth switch transistor is connected to the second adjusting point.

Preferably, both the first MOS transistor and the second MOS transistor are P-type MOS transistors.

Preferably, the first switch transistor, the second switch transistor and the third switch transistor are P-type MOS transistors.

Preferably, the fourth MOS transistor, the fifth MOS transistor, the sixth MOS transistor, and the seventh MOS transistor are N-type MOS transistors.

Preferably, the eighth switch transistor and the ninth switch transistor are P-type MOS transistors.

By adopting the above-mentioned technical solution, the present invention has beneficial effects such that the addition of the adjusting branch can cause the response speed to be adjusted when the clock signal changes, so that the response time of the circuit is further improved, the resolution of the high-speed decision device is improved, and the clock and data recovery performance of the high-speed decision device is further improved.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
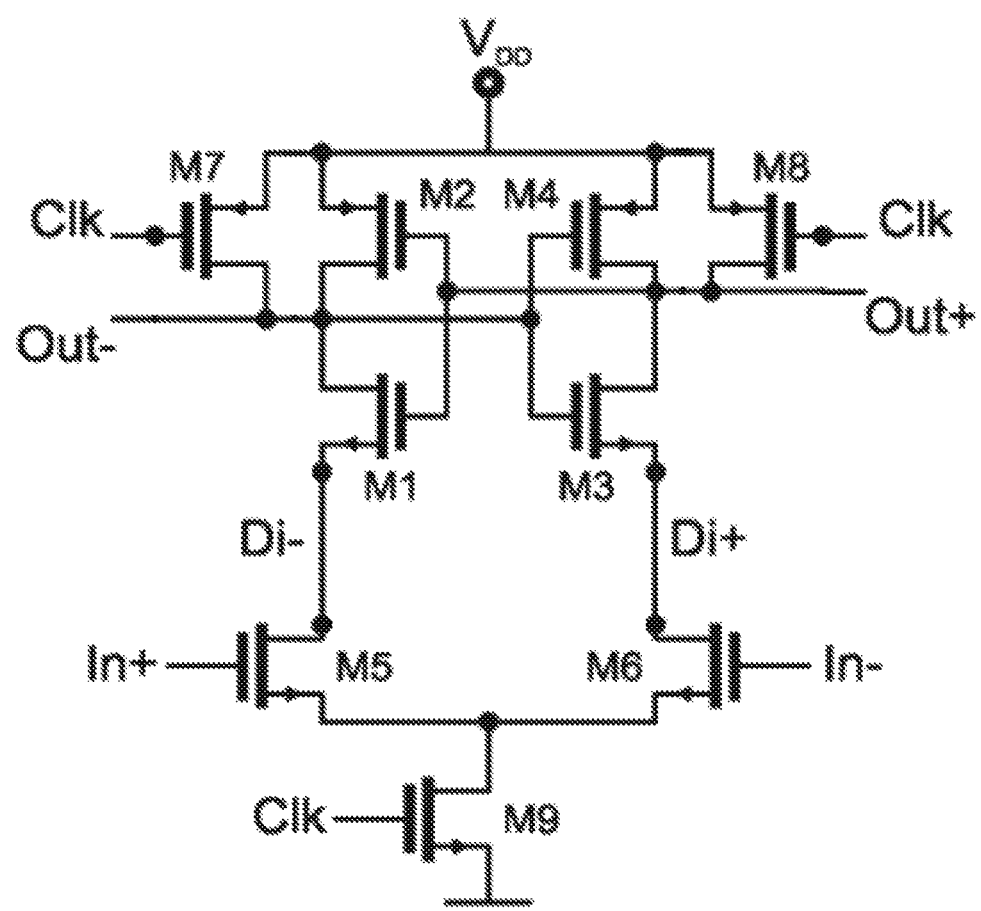
FIG. 1 is a circuit diagram of a conventional decision device in the prior art.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about", or "approximately" shall generally mean within 20 percent, preferably within 10 percent, and more preferably within 5 percent of a given value or range. Numerical quantities given herein are approximate, meaning that the term "around", "about", or "approximately" can be inferred if not expressly stated.

As used herein, the term "plurality" means a number greater than one.

Hereinafter, certain exemplary embodiments according to the present disclosure will be described with reference to the accompanying drawings.

In the prior art, as shown in FIG. 1, the decision device includes a differential circuit and a decision circuit. When a clock signal CLK is low, the high-speed decision device is in a reset state, and a normal-phase output end Out+ and an inverted-phase output end Out− are at high levels; when the clock signal CLK is high, an input circuit judges the levels of input signals In+ and In−. Since there exists a regenerative feedback circuit including switch transistors M3, M4, and M2, M1, the regenerative feedback circuit pulls the output of a high-level section low, and pulls the output of a lower-level section high. For the above-mentioned circuit, a certain length of response time is required to provide initial voltages on source sides of the switch transistors M3 and M1, causing the operating speed of the above-mentioned decision to be reduced.

Given that the foregoing problems exist in the prior art, the present invention provides a high-speed decision device, applied to a high-speed clock and data recovery circuit, including: a first branch and a second branch, connected in parallel between a VDD and a clock signal input end CLK; in which the first branch is configured to provide a normal-phase input end IN+, the second branch is configured to provide an inverted-phase input end IN−, a first adjusting point Q1 is arranged at the normal-phase input end IN+ and the VDD, and a second adjusting point Q2 is arranged at the inverted-phase input end IN− and the VDD; an adjusting branch 2 is arranged between the first adjusting point Q1 and the second adjusting point Q2 to adjust a respond speed of a clock signal change.

Figure 2:
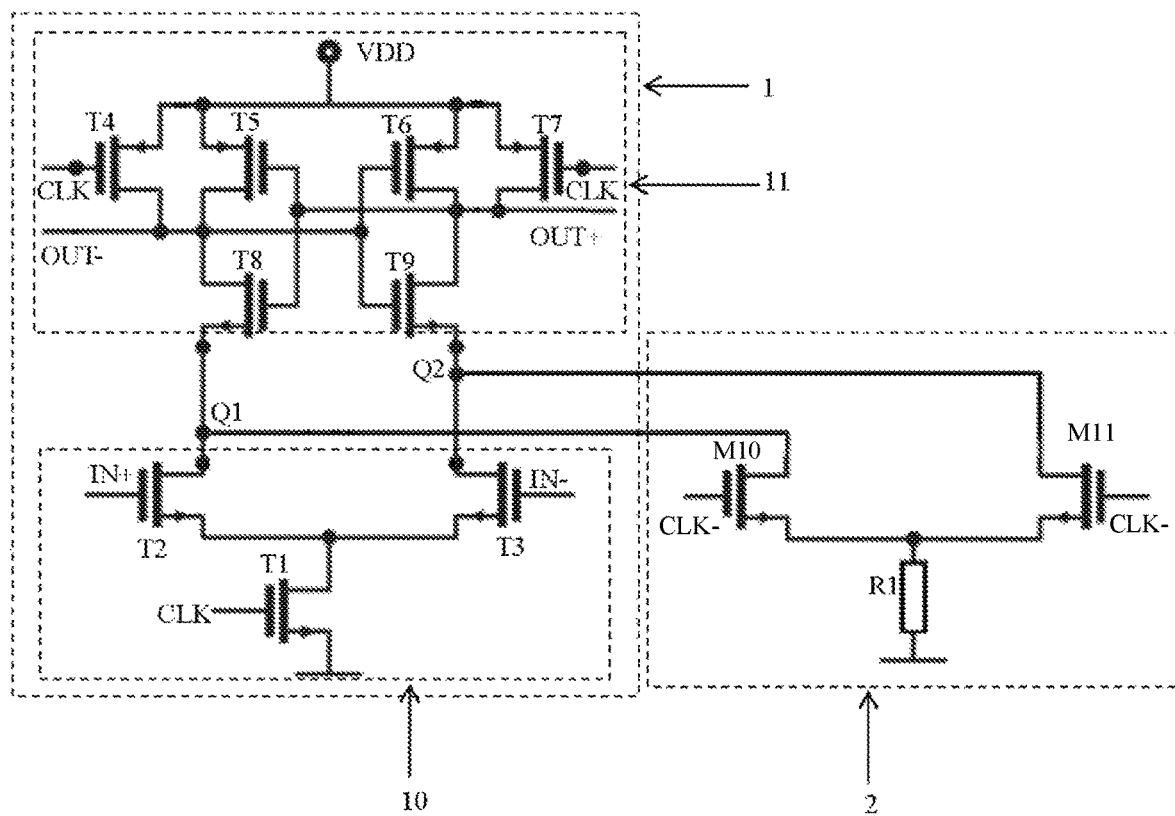
FIG. 2 is a circuit diagram of a high-speed decision device according to an embodiment of the present invention.

The technical solution of the high-speed decision device is applied to a high-speed clock and data recovery circuit, as shown in FIG. 2. The high-speed decision device aims to adjust the response speed when the clock signal changes by the addition of the adjusting branch 2. In particular, when the clock signal is negative, the clamp of the adjusting branch 2 is driven to an intermediate level. When the next positive clock signal arrives, the decision device may start to work from the intermediate level. In this way, the response time of the circuit is further improved, the resolution of the high-speed decision device is improved, and the clock and data recovery performance of the high-speed decision device is further improved.

In a preferred embodiment, the adjusting branch includes: a first MOS transistor M10, in which a gate of the first MOS transistor M10 is connected to the clock signal input end CLK−, a source of the first MOS transistor M10 is connected to the ground GND through a first resistor R1, and a drain of the first MOS transistor M1 is connected to the first adjusting point Q1; a second MOS transistor M11, in which a gate of the second MOS transistor M11 is connected to the clock signal input end CLK−, a source of the second MOS transistor M11 is connected to the source of the first MOS transistor M10, and a drain of the second MOS transistor M11 is connected to the second adjusting point Q2.

In the above-mentioned technical solution, as shown in FIG. 2, the first MOS transistor M10 and the second MOS transistor M11 are P-type MOS transistors. When a negative clock signal CLK− is input to the clock signal input end CLK−, a first switch transistor T1 is switched off and the adjusting branch 2 starts to work. Then the first MOS transistor M10 is switched off, and the second MOS transistor M11 starts to work, and a clamp voltage is formed on the first resistor R1, that is, the adjusting branch is clamped to an intermediate level between the first adjusting point Q1 and the second adjusting point Q2. When the next positive clock signal arrives, the decision device may start to work from the intermediate level. In this way, the response time of the circuit is further improved, the resolution of the high-speed decision device is improved, and the clock and data recovery performance of the high-speed decision device is further improved.

In a preferred embodiment, the first branch and the second branch form a differential amplifier circuit 1, the differential amplifier circuit 1 includes: a differential amplifier module 10, controllably connected between the clock signal input end CLK, the normal-phase input end IN+, the inverted-phase input end IN−, the first adjusting point Q1 and the second adjusting point Q2; a decision module 11, controllably connected between the first adjusting point Q1, the second adjusting point Q2, a positive output end OUT+, and a negative output end OUT−.

In the above-mentioned technical solution, as shown in FIG. 2, the differential amplifier circuit 1 includes a VDD for providing a power supply voltage; a clock signal input end CLK for providing a periodic positive clock signal and a periodic negative clock signal CLK−; a normal-phase input end IN+ for connecting a first input signal; an inverted-phase input end IN− for connecting a second input signal; a positive output end OUT+ for outputting a first output signal; a negative output end OUT− for outputting a second output signal; a differential amplifier circuit 1 consisting of a plurality of switch transistors, controllably connected between the VDD, the normal-phase input end IN+, the inverted-phase input end IN−, the positive output end OUT+ and the negative output end OUT−, and configured to determine the first input signal and the second input signal for the differential amplification when positive clock signal is input to the clock signal input end, so as to output the first output signal and the second output signal, respectively.

Specifically, as shown in FIG. 2, the differential amplifier module 10 includes: a first switch transistor T1, in which a gate of the first switch transistor T1 is connected to the clock signal input end CLK, and a source of the first switch transistor T1 is connected to the ground GND; a second switch transistor T2, in which a gate of the second switch transistor T2 is connected to the normal-phase input end IN+, a source of the second switch transistor T2 is connected to a drain of the first switch transistor T1, and a drain of the second switch transistor T2 is connected to the first adjusting point Q1; and a third switch transistor T3, in which a gate of the third switch transistor T3 is connected to the inverted-phase input end IN−, a source of the third switch transistor T3 is connected to the source of the second switch transistor T2, and a drain of the third switch transistor T3 is connected to the second adjusting point Q2.

Further, as shown in FIG. 2, the decision module 11 includes: a fourth switch transistor T4, in which a gate of the fourth switch transistor T4 is connected to the clock signal input end CLK, a source of the fourth switch transistor T4 is connected to VDD, and a drain of the fourth switch transistor T4 is connected to the negative output end OUT−; a fifth switch transistor T5, in which a gate of the fifth switch transistor T5 is connected to the positive output end OUT+, a source of the fifth switch T5 transistor is connected to a VDD, and a drain of the fifth switch transistor T5 is connected to the negative output end OUT−; a sixth switch transistor T6, in which a gate of the sixth switch transistor T6 is connected to the negative output end OUT−, a source of the sixth switch transistor T6 is connected to a VDD, and a drain of the sixth switch transistor T6 is connected to the positive output end OUT+; a seventh switch transistor T7, in which a gate of the seventh switch transistor T7 is connected to the clock signal input end CLK, a source of the seventh switch transistor T7 is connected to VDD, and a drain of the seventh switch transistor T7 is connected to the positive output end OUT+; an eighth switch transistor T8, in which a gate of the eighth switch transistor T8 is connected to the gate of the fifth switch transistor T5, a source of the eighth switch transistor T8 is connected to the first adjusting point Q1, and a drain of the eighth switch transistor T8 is connected to the drain of the fifth switch transistor T5; and a ninth switch transistor T9, in which a gate of the ninth switch transistor T9 is connected to the gate of the sixth switch transistor T6, a drain of the ninth switch transistor T9 is connected to the drain of the sixth switch transistor T6, and a source of the ninth switch transistor T9 is connected to the second adjusting point Q2.

In the above-mentioned technical solution, as shown in FIG. 2, the high-speed decision device is applied to the high-speed clock and data recovery circuit. The high-speed decision device mainly includes a differential amplifier circuit 1 and an adjusting branch 2, in which the first switch transistor T1, the second switch transistor T2, the third switch transistor T3, the eighth switch transistor T8, and the ninth switch transistor T9 are P-type MOS transistors; the fourth switch transistor T4, the fifth switch transistor T5, the sixth switch transistor T6, and the seventh switch transistor T7 are N-type MOS transistors.

Further, when the positive clock signal is input to the clock signal input end CLK, the first switch transistor T1 is switched on, and the differential amplifier module 10 starts to work. A differential pair transistor consisting of the eighth switch transistor T8 and the ninth switch transistor T9 amplifies the first input signal and the second input signal input from the normal-phase input end IN+ and the inverted-phase input end IN−, and the amplified first input signal and second input signal are output to the decision module 11.

Further, a regenerative feedback circuit, consisting of the fifth switch transistor T5, the sixth switch transistor T6, the eighth switch transistor T8 and the ninth switch transistor T9 in the decision module 11, determines the amplified first input signal and second input signal and outputs the result through the positive output end OUT+ and the negative output end OUT−.

Further, when a negative clock signal CLK− is input to the clock signal input end CLK−, a first switch transistor T1 is switched off and the adjusting branch 2 starts to work. Then the first MOS transistor M1 is switched off, and the second MOS transistor M11 starts to work, and a clamp voltage is formed on the first resistor R1, that is, the adjusting branch is clamped to an intermediate level between the first adjusting point Q1 and the second adjusting point Q2. When the next positive clock signal arrives, the decision device may start to work from the intermediate level. Further, the adjusting branch 2 is added to adjust the response speed when the clock signal changes, so that the response time of the circuit is further improved, the resolution of the high-speed decision device is improved, and the clock and data recovery performance of the high-speed decision device is further improved.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A high-speed decision device, applied to a high-speed clock and data recovery circuit, comprising:
   a first branch and a second branch, connected in parallel between a VDD and a clock signal input end;
   wherein the first branch is configured to provide a normal-phase input end, the second branch is configured to provide an inverted-phase input end, a first adjusting point is arranged at the normal-phase input end and the VDD, and a second adjusting point is arranged at the inverted-phase input end and the VDD;

an adjusting branch is arranged between the first adjusting point and the second adjusting point to adjust a respond speed of a clock signal change, the adjusting branch comprises:
a first MOS transistor, wherein a gate of the first MOS transistor is connected to the clock signal input end, a source of the first MOS transistor is connected to the ground through a first resistor, and a drain of the first MOS transistor is connected to the first adjusting point;
a second MOS transistor, wherein a gate of the second MOS transistor is connected to the clock signal input end, a source of the second MOS transistor is connected to the source of the first MOS transistor, and a drain of the second MOS transistor is connected to the second adjusting point.

2. The high-speed decision device of claim 1, wherein the first branch and the second branch form a differential amplifier circuit, the differential amplifier circuit comprises:
a differential amplifier module, controllably connected between the clock signal input end, the normal-phase input end, the inverted-phase input end, the first adjusting point and the second adjusting point;
a decision module, controllably connected between the first adjusting point, the second adjusting point, a positive output end, and a negative output end.

3. The high-speed decision device of claim 2, wherein the differential amplifier module comprises:
a first switch transistor, wherein a gate of the first switch transistor is connected to the clock signal input end, and a source of the first switch transistor is connected to the ground;
a second switch transistor, wherein a gate of the second switch transistor is connected to the normal-phase input end, a source of the second switch transistor is connected to a drain of the first switch transistor, and a drain of the second switch transistor is connected to the first adjusting point; and
a third switch transistor, wherein a gate of the third switch transistor is connected to the inverted-phase input end, a source of the third switch transistor is connected to the source of the second switch transistor, and a drain of the third switch transistor is connected to the second adjusting point.

4. The high-speed decision device of claim 2, wherein the decision module comprises:

a fourth switch transistor, wherein a gate of the fourth switch transistor is connected to the clock signal input end, a source of the fourth switch transistor is connected to VDD, and a drain of the fourth switch transistor is connected to the negative output end;
a fifth switch transistor, wherein a gate of the fifth switch transistor is connected to the positive output end, a source of the fifth switch transistor is connected to VDD, and a drain of the fifth switch transistor is connected to the negative output end;
a sixth switch transistor, wherein a gate of the sixth switch transistor is connected to the negative output end, a source of the sixth switch transistor is connected to VDD, and a drain of the sixth switch transistor is connected to the positive output end;
a seventh switch transistor, wherein a gate of the seventh switch transistor is connected to the clock signal input end, a source of the seventh switch transistor is connected to VDD, and a drain of the seventh switch transistor is connected to the positive output end;
an eighth switch transistor, wherein a gate of the eighth switch transistor is connected to the gate of the fifth switch transistor, a source of the eighth switch transistor is connected to the first adjusting point, and a drain of the eighth switch transistor is connected to the drain of the fifth switch transistor; and
a ninth switch transistor, wherein a gate of the ninth switch transistor is connected to the gate of the sixth switch transistor, a drain of the ninth switch transistor is connected to the drain of the sixth switch transistor, and a source of the ninth switch transistor is connected to the second adjusting point.

5. The high-speed decision device of claim 1, wherein both the first MOS transistor and the second MOS transistor are P-type MOS transistors.

6. The high-speed decision device of claim 3, wherein the first switch transistor, the second switch transistor and the third switch transistor are P-type MOS transistors.

7. The high-speed decision device of claim 4, wherein the fourth MOS transistor, the fifth MOS transistor, the sixth MOS transistor, and the seventh MOS transistor are N-type MOS transistors.

8. The high-speed decision device of claim 4, wherein the eighth switch transistor and the ninth switch transistor are P-type MOS transistors.

* * * * *